United States Patent [19]
Nakajima et al.

[11] Patent Number: 6,115,260
[45] Date of Patent: Sep. 5, 2000

[54] MEMORY MODULE WITH OBSTACLE REMOVING TERMINAL STRUCTURE

[75] Inventors: Takao Nakajima; Tetsurou Tsuji; Tetsuro Washida, all of Tokyo, Japan

[73] Assignee: Mitsubishi Denki Kabushiki Kaisha, Tokyo, Japan

[21] Appl. No.: 09/258,403

[22] Filed: Feb. 26, 1999

[30] Foreign Application Priority Data

Oct. 1, 1998 [JP] Japan .................................. 10-279730

[51] Int. Cl.$^7$ .................................................. H05K 1/18
[52] U.S. Cl. ........................... 361/760; 361/785; 361/764; 361/765; 439/951; 439/55; 439/954; 174/260; 174/261; 174/68.1
[58] Field of Search ..................................... 361/760, 764, 361/765, 777, 785, 791; 439/62, 61, 59, 629, 630, 65, 68, 951, 954, 55; 257/684, 723, 782, 786; 174/260, 68.1, 261

[56] References Cited

U.S. PATENT DOCUMENTS

| | | | |
|---|---|---|---|
| 5,037,315 | 8/1991 | Collier et al. ............................... | 439/83 |
| 5,309,316 | 5/1994 | Yagi et al. ................................. | 361/749 |
| 5,446,317 | 8/1995 | Sato et al. ................................. | 257/734 |
| 5,449,297 | 9/1995 | Bellomo et al. .......................... | 439/630 |
| 5,492,478 | 2/1996 | White ....................................... | 439/76.1 |
| 5,650,917 | 7/1997 | Hsu .......................................... | 361/759 |
| 5,708,297 | 1/1998 | Clayton .................................... | 257/723 |
| 5,754,408 | 5/1998 | Derouiche ................................ | 361/773 |
| 5,841,686 | 11/1998 | Chu et al. ................................. | 365/51 |
| 5,856,937 | 1/1999 | Chu et al. ................................. | 365/51 |

FOREIGN PATENT DOCUMENTS

| | | |
|---|---|---|
| 7-231153 | 8/1995 | Japan . |
| 9-7709 | 1/1997 | Japan . |

*Primary Examiner*—Hyung-Sub Sough
*Assistant Examiner*—David Foster
*Attorney, Agent, or Firm*—McDermott, Will & Emery

[57] ABSTRACT

A terminal structure in a memory module includes a male connector having a plurality of terminal strips adapted to be engaged with the terminal tongues in the female socket. Each of the terminal strips has an obstacle removal portion defined therein for removing foreign matter present on at least one of the terminal tongues.

9 Claims, 6 Drawing Sheets

MEMORY MODULE WITH OBSTACLE REMOVING TERMINAL STRUCTURE

BACKGROUND OF THE INVENTION

1. Field of the Invention

The present invention generally relates to a memory module and, more particularly, to the terminal structure of the memory module that can be removably inserted in a dedicated socket.

2. Description of the Prior Art

A memory module of a type adapted to be removably inserted in a dedicated socket mounted on a computer mother board has long been well known. Examples of the memory module of the type referred to above includes a DRAM module that is removably inserted in a SIMM socket or a DIMM socket.

FIG. 14 illustrates a schematic perspective view showing a memory module 100 and a printed circuit board 200 having a female socket 201 for the memory module 100 fixedly mounted thereon. The memory module 100 comprises a generally rectangular substrate 101 having a plurality of, for example, three memory chips 102, 103 and 104 mounted on at least one surface thereof in side-by-side fashion in a direction longitudinally of the substrate 101. One of the opposite side portions of the substrate 101, or a lower edge portion of the substrate 101 as viewed in FIG. 14, serves as a male connector 106. This male connector 106 includes an array of equally spaced terminal strips 105a positioned on one of the opposite surfaces of the substrate 101 and an array of equally spaced terminal strips 105b (See FIGS. 15 and 16) positioned on the other of the opposite surfaces of the substrate 101, each of said arrays of the terminal strips 105a and 105b extending in a direction longitudinally of the substrate 101. Each of the terminal strips 105a and 105b is generally in the form of a generally rectangular flat and thin conductor made of gold.

In the case of the 168-pins DIMM (Dual In-line Memory Module), 84 terminal strips, 1 mm in width, are arrayed at the pitch of 0.27 mm on each of the opposite surfaces of the substrate 101 adjacent the lower side thereof. On the other hand, in the case of the 144-pins DIMM, 72 terminal strips, 0.5 mm in width, are arrayed at the pitch of 0.3 mm on each of the opposite surfaces of the substrate 101 adjacent the lower side thereof.

Referring to FIG. 15 which illustrates a cross-section of the memory module 100 and the printed circuit board 200 taken along the line XV-XV' in FIG. 14, the female socket 201 mounted on the printed circuit board 200 includes an array of terminal tongues 202, equal in number to and engageable with the terminal strips 105a, and another array of similar terminal tongues 203 equal in number to and engageable with the terminal strips 105b are formed in respective interior walls of the female socket 201 that are opposed to each other.

In this known terminal structure, electrically insulating foreign matter 110 such as frush or fragment may often be found resting on or adhering to one or some of the terminal tongues 202 and/or 203. If while the foreign matter 110 is found resting on or adhering to one of the terminal tongues 202 as shown in FIG. 15 an attempt is made to insert the memory module 100 into the female socket 201, there is a high possibility that one of the terminal strips 105 which is to be electrically connected with such one of the terminal tongues 202 will fail to establish a circuit with the mating terminal tongue 202 with the foreign matter 110 jammed between the terminal strip 105 and the terminal tongue 202 as shown in FIG. 16.

The Japanese Laid-open Patent Publication No. 7-231153, published Aug. 29, 1995, discloses a card edge substrate having an edge portion adapted to be removably inserted in a dedicated female socket. At least one surface of the card edge substrate is formed with a plurality of juxtaposed card edge terminals spaced an equal distance from each other. Each of the card edge terminals has a tip terminating at a location spaced a slight distance inwardly from the edge of the card edge substrate. An elongated solder resist layer in the form of an elongated layer of synthetic resin is deposited on the edge portion of the card edge substrate so as to cover the respective tips of the card edge terminals. This solder resist layer is adapted to be trapped by flexible terminal tongues in the female socket to avoid an fall-off or accidental separation of the card edge substrate from the female socket.

In this known terminal structure, as the card edge substrate is inserted into the female socket with the edge thereof received within the female socket, the elongated solder resist layer relatively slides over the terminal tongues while the latter are urged against their own resiliency to allow the solder resist layer to pass and is subsequently caught by the terminal tongues then restoring to the original shape by the effect of their own resiliency.

The publication No. 7-231153 describes that the elongated solder resist layer is made of the synthetic resin which, when cured, provides a minimized resistance to the terminal tongues that pass in sliding contact therewith and is also so shaped as to minimize the possibility of an fall-off or accidental separation of the card edge substrate from the female socket.

However, it has been found that the elongated solder resist layer disclosed in the publication No. 7-231153 is ineffective to remove the foreign matter resting on one or some of the terminal tongues in the female socket and, hence, ineffective to eliminate the possible connection failure.

The Japanese Laid-open Patent Publication No. 9-7709, published Jan. 10, 1997, discloses the use of stepwise cutouts in the edge of the card or substrate so that the force required to push the card into the female socket or socket can be minimized. Considering, however, that the card or substrate disclosed in the publication No. 9-7709 makes use of flat and thin conductors similar to the terminal strips 105 and 105b shown in FIGS. 14 to 16, the terminal structure is ineffective to eliminate the foreign matter resting or adhering to one or some of the socket tongues.

SUMMARY OF THE INVENTION

Accordingly, the present invention is intended to provide an improved terminal structure in the memory module that is effective to expel the foreign matter resting on or adhering to one or some of the flexible terminal tongues in the female socket to thereby ensure an electric connection between the terminal strips in the memory module and the terminal tongues in the female socket.

In order to accomplish the foregoing object, the present invention provides a terminal structure in a module comprising a male connector having a plurality of terminal strips adapted to be engaged with the terminal tongues in the female socket. Each of the terminal strips has an obstacle removal portion defined therein for removing foreign matter present on at least one of the terminal tongues.

According to the present invention, because of the provision of the obstacle removal portion in each of the terminal strips, the foreign matter present on one or some of the terminal tongues can be effectively removed as a male connector is inserted into the female socket with the terminal strips aligned with the mating terminal tongues in the female socket.

The obstacle removal portion defined in each of the terminal strips may comprises at least one cutout defined in the respective terminal strip so as to extend in a direction at an angle relative to a longitudinal sense of the terminal strip. This cutout is preferably in the form of an elongated cutout either extending generally perpendicular to the longitudinal sense of the respective terminal strip or extending from a predetermined point on the respective terminal strip in a direction diagonally upwardly with respect to the direction of insertion of the male connector into the female socket.

Alternatively, the obstacle removal portion in each of the terminal strips may comprise at least one protrusion defined in the respective terminal strip so as to extend in a direction either parallel to or at an angle relative to the longitudinal sense of the terminal strip. If desired, a plurality of protrusions may be employed as the obstacle removal portion, in which case the plural protrusions preferably extend in a direction at an angle relative to the longitudinal sense of the terminal strip. The plural protrusions may extend either parallel to each other or in a generally grid pattern.

Instead of the protrusion or protrusions, at least one row of recesses may be equally employed for the obstacle removal portion.

In any event, the cutout in the respective terminal strip regardless of whether it comprises one or more protrusions or recesses provides a surface indentation in such terminal strip by which, as the male connector is inserted into the female socket the foreign matter present on the terminal tongue can effectively expelled out of such terminal tongue.

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF THE EMBODIMENTS

As hereinbefore discussed, the present invention provides a terminal structure in a module 1 comprising a male connector 7 having a plurality of terminal strips equal in number to and adapted to be engaged with the terminal tongues in the female socket 51. Each of the terminal strips has an obstacle removal portion defined therein for removing foreign matter present on at least one of the terminal tongues.

In any event, the present invention will now be described with reference to the accompanying drawings which show preferred forms of embodiment thereof only for illustration purpose, but not limiting the scope of the present invention.

First Embodiment

Figure 1:
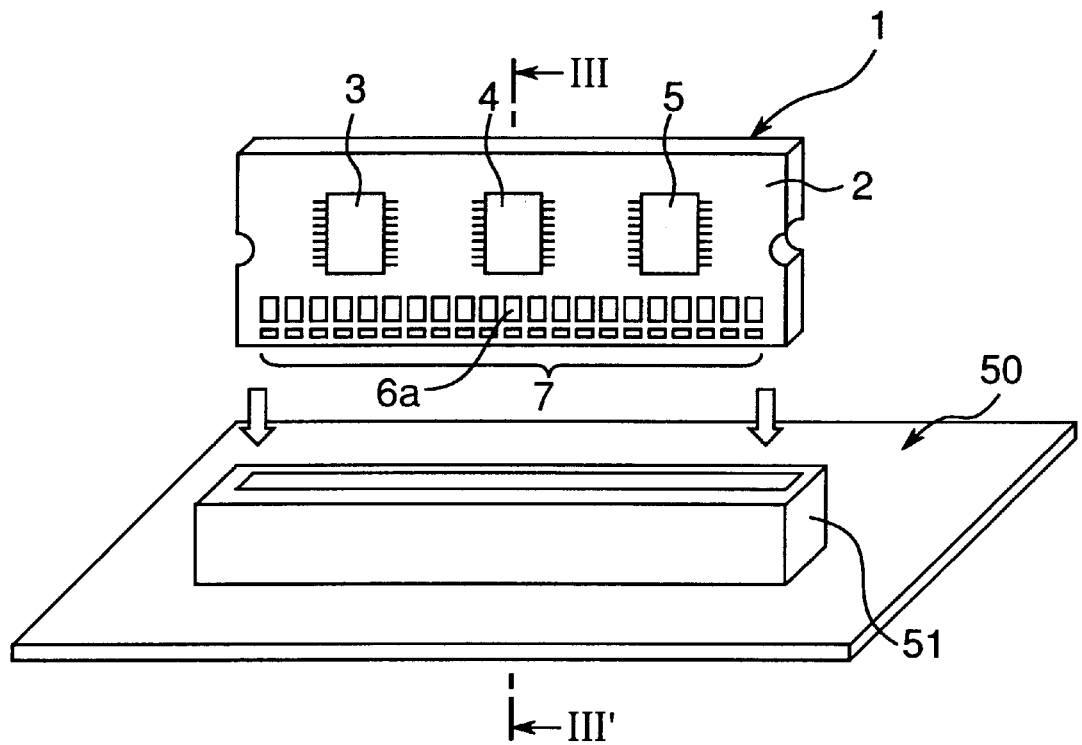
FIG. 1 is a schematic perspective view of a terminal structure according to a first preferred embodiment of the present invention, showing a memory module and a printed circuit board having a female socket for the memory module.
Figure 2A:
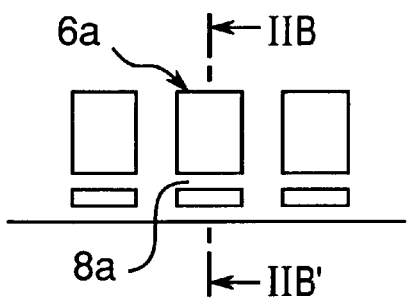
FIG. 2A is a fragmentary front elevational view, on an enlarged scale, of a portion of a male connector in the memory module shown in FIG. 1.
Figure 2B:
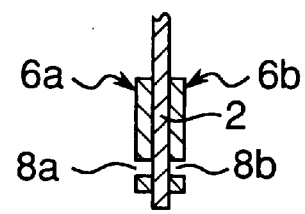
FIG. 2B is a cross-sectional view taken along the line IIB-IIB' in FIG. 2A.
Figure 3:
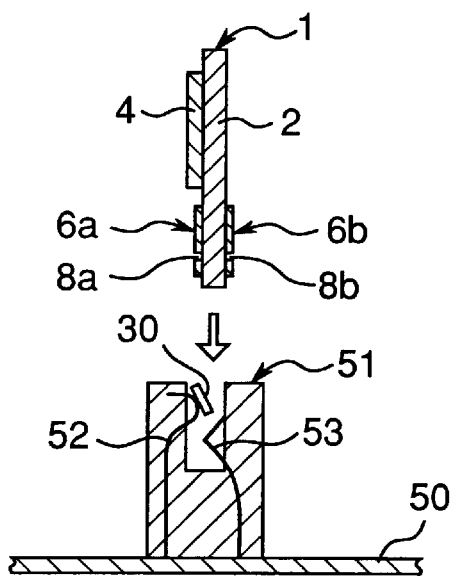
FIG. 3 is a cross-sectional view taken along the line III-III' in FIG. 1.
Figure 4:
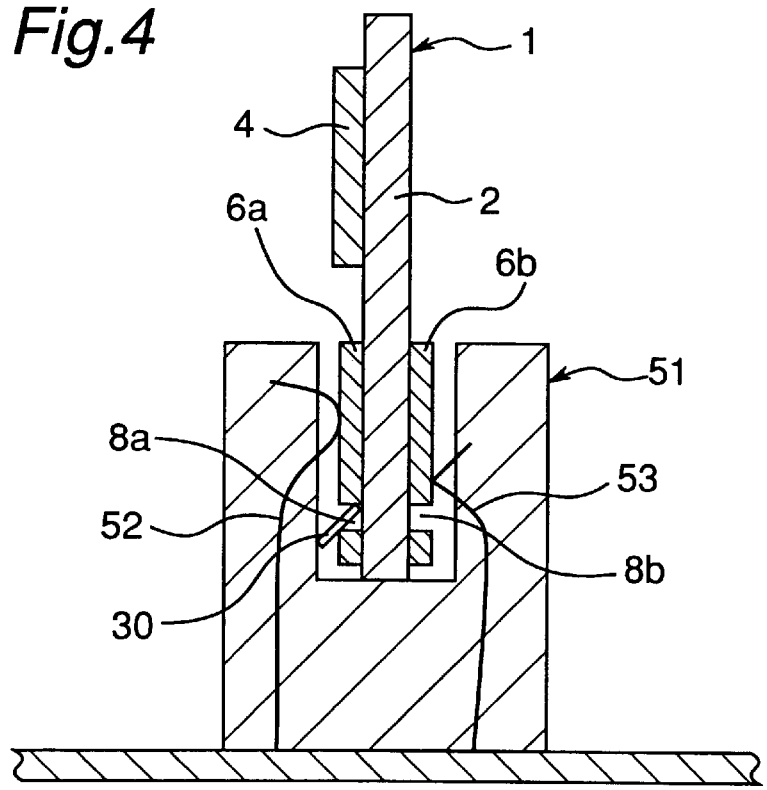
FIG. 4 is a view similar to FIG. 3 showing the memory module inserted into the female socket on the printed circuit board.

Referring to FIGS. 1 to 4, a printed circuit board 50 is shown to have the female socket 51 fixedly mounted thereon. As best shown in FIGS. 3 and 4, the female socket 51 is of a configuration having interior walls that are opposed to each other with a socket groove defined therebetween, and includes first and second arrays of equally spaced terminal tongues 52 and 53, each having a free end portion exposed to and resiliently deformably protruding into the socket groove. The female socket 51 of the structure discussed above is well known to those skilled in the art and, therefore, no further detail thereof will be discussed for the sake of brevity.

The memory module 1 comprises a generally rectangular substrate 2 having a plurality of, for example, three memory chips 3, 4 and 5 mounted on at least one surface thereof in side-by-side fashion in a direction longitudinally of the substrate 2. One of the opposite side portions of the substrate 2, or a lower edge portion of the substrate 2 as viewed in FIG. 1, serves as the male connector 7.

This male connector 7 includes a first array of equally spaced terminal strips 6a positioned on one of the opposite surfaces of the substrate 2 and a second array of equally spaced terminal strips 6b positioned on the other of the opposite surfaces of the substrate 2, each of the first and second arrays of the terminal strips 6a and 6b extending in a direction longitudinally of the substrate 2. Each of the terminal strips 6a and 6b of each array is generally in the form of a generally rectangular flat and thin conductor made of gold.

The number of the terminal strips 6a or 6b of each array may be equal to that of the mating terminal tongues 52 or 53 in the female socket 51, but may not be always limited thereto depending on the specific circuit configuration in which the memory module 1 and the female socket 51 are employed. For a similar reason, the number of the terminal strips 6a of the first array may be or may not be equal to that of the terminal strips 6b of the second array. In any event, in the illustrated embodiment, the first and second arrays of the terminal strips 6a and 6b are electrically engaged with the terminal tongues 52 and the terminal tongues 52, respectively, when the memory module 1 is mounted on the female socket 51 with the male connector 7 received within the socket groove in the female socket 51 in a manner well known to those skilled in the art.

As best shown in FIGS. 2A and 2B, each of the terminal strips 6a and 6b has an obstacle removal portion defined therein, which is, in the embodiment shown in FIGS. 1 to 4, in the form of a cutout 8a or 8b defined therein so as to extend generally perpendicular to the longitudinal sense of the corresponding terminal strip 6a or 6b and also so as to divide the corresponding terminal strip 6a or 6b into two strip pieces. Because of the presence of the cutout 8a or 8b in each of the terminal strips 6a and 6b, the corresponding terminal strip 6a or 6b has a surface indentation into which foreign matter 30, shown exaggeratedly in FIGS. 3 and 4 and resting on the mating terminal tongue 52 or 53, can be trapped as shown in FIG. 4 as the male connector 7 is inserted into the female socket 51.

The foreign matter 30 may be a frush or fragment that is removed from a lower edge portion of the substrate 2 as a result of collision between it and the female socket 51 during an attempt to insert the memory module 1 into the female socket 51. Alternatively, the foreign matter 30 may be a substantially solid particle which may be deposited on one or more of the terminal tongues 52 and 53 while the female socket 51 is left open for a substantial length of time.

Thus, it is clear that the cutouts 8a and 8b defined in the terminal strips 6a and 6b are effective to clear the foreign matter 30 out of one or more terminal tongues 52 and 53, on which it has been deposited, and to trap it. Accordingly, as clearly shown in FIG. 4, there is no possibility that one or more of the terminal strips 6a and 6b will fail to establish a circuit with the mating terminal tongue or tongues 52 and 53.

Although in the illustrated embodiment each terminal strip 6a and 6b is shown as having one cutout 8a and 8b, the obstacle removal portion may comprise a plurality of cutouts in each terminal strip 6a and 6b so as to divide the latter into a corresponding number of strip pieces. The use of the plural cutouts in each terminal strip 6a and 6b is rather feasible since the capability of the obstacle removal portion to remove the foreign matter 30 can be enhanced.

Second Embodiment

Figure 5A:
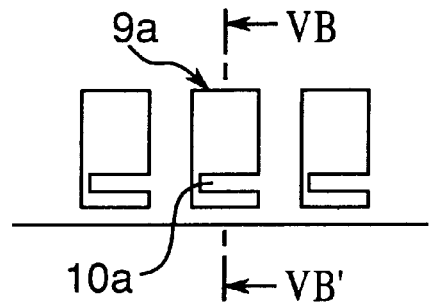
FIG. 5A is a view similar to FIG. 2A, showing a second preferred embodiment of the present invention.
Figure 5B:
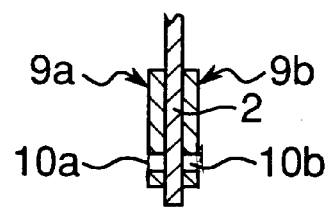
FIG. 5B is a cross-sectional view taken along the line VB-VB' in FIG. 5A.

Referring to FIGS. 5A and 5B, the first and second arrays of the terminal strips are identified by 9a and 9b, respectively. In this embodiment, the obstacle removal portion defined in each of the terminal strips 9a and 9b comprises at least one generally U-shaped cutout 10a and 10b extending inwardly from one side of the respective terminal strip 9a and 9b in a direction perpendicular to the longitudinal sense of the terminal strip 9a and 9b so as to terminate at a location spaced a distance inwardly from the opposite side of the respective terminal strip 9a and 9b.

As is the case with the foregoing embodiment, the generally U-shaped cutouts 10a and 10b provide surface indentations in the terminal strips 9a and 9b and, therefore, the foreign matter 30 on the mating terminal tongue 52 or 53, can be trapped into the associated cutout 10a or 10b as the male connector 7 is inserted into the female socket 51.

The embodiment shown in FIGS. 5A and 5B brings about an additional advantage. The terminal strips 9a and 9b are formed on the substrate 2 by the use of a known electroplating technique. As is well known to those skilled in the art, the electroplating technique requires electrodes to be connected with portions to be electroplated. On the other hand, as compared with the cutouts 8a and 8b employed in the previously described embodiment, the U-shaped cutouts 10a and 10b do not divide the associated terminal strips 9a and 9b into two strip pieces and, therefore, the number of the electrodes required during the practice of the electroplating technique may be half that required to form the cutouts 8a and 8b and, thus, the electroplating can advantageously be simplified.

First Modification

Figure 6A:
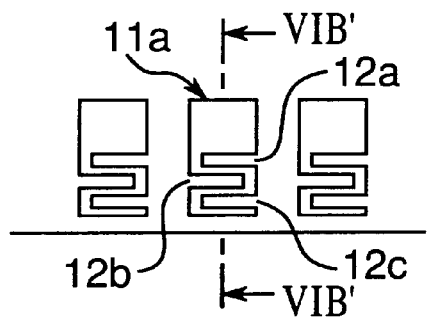
FIG. 6A is a view similar to FIG. 2A, showing a first modification of the second preferred embodiment of the present invention.
Figure 6B:
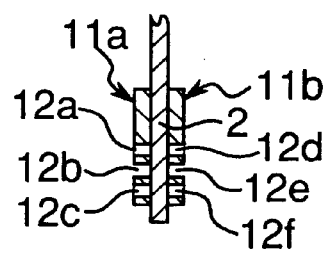
FIG. 6B is a cross-sectional view taken along the line VIB-VIB' in FIG. 6A.

In the second embodiment of the present invention, each terminal strip 9a and 9b has been shown and described as formed with the single U-shaped cutout 10a and 10b. However, in the modification of the second embodiment shown in FIGS. 6A and 6B, a plurality of, for example, three U-shaped cutouts 12a, 12b and 12c, or 12d, 12e and 12f, each similar in shape to the cutout 10a and 10b are employed in each terminal strip 11a and 11b. Specifically, the cutouts 12a and 12c or 12d and 12f are cut inwardly from one side of each terminal strip 11a or 11b so as to extend parallel to each other whereas the cutout 112b or 12e is cut inwardly from the opposite side of the respective terminal strip 11a or 11b and positioned between the cutouts 12a and 12c or 12e and 12f.

Second Modification

Figure 7A:
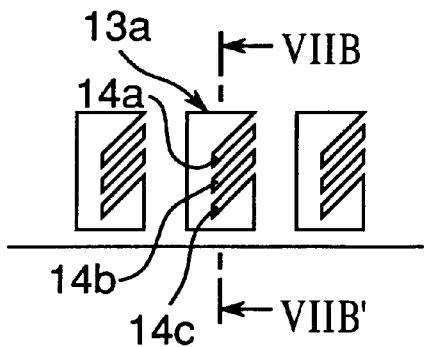
FIG. 7A is a view similar to FIG. 2A, showing a second modification of the second preferred embodiment of the present invention.
Figure 7B:
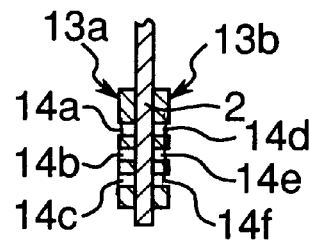
FIG. 7B is a cross-sectional view taken along the line VIIB-VIIB' in FIG. 7A.

In the second modification of the second embodiment as shown in FIGS. 7A and 7B, a plurality of, for example, three U-shaped cutouts 14a, 14b and 14c, or 14d, 14e and 14f, are formed in each terminal strip 13a and 13b so as to extend parallel to each other and also so as to extend from a predetermined point on the respective terminal strip 13a and 13b in a direction generally diagonally upwardly with respect to the direction of insertion of the male connector 7 into the female socket 51. In other words, the cutouts 14a, 14b and 14c, or 14d, 14e and 14f, are cut inwardly from one side of each terminal strip 13a and 13b in a direction generally diagonally downwardly towards a predetermined point on the respective terminal strip 13a and 13b with respect to the direction of insertion of the male connector 7 into the female socket 51.

The inclined cutouts 14a to 14f are particularly advantageous in that the foreign matter 30 caught in at least one of the inclined cutouts 14a to 14f can be guided upwardly therealong to clear out of the associated terminal strip 13a or 13b as the male connector 7 is inserted into the female socket 51.

Third Embodiment

Figure 8A:
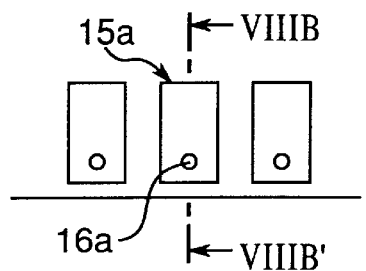
FIG. 8A is a view similar to FIG. 2A, showing a third preferred embodiment of the present invention.
Figure 8B:
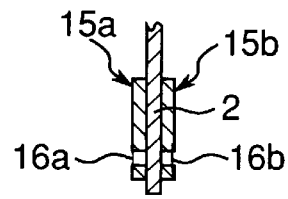
FIG. 8B is a cross-sectional view taken along the line VIIIB-VIIIB' in FIG. 8A.

In the third embodiment of the present invention shown in FIGS. 8A and 8B, the obstacle removal portion defined in each of the terminal strips now identified by 15a and 15b on the opposite surfaces of the substrate 2 comprises at least one round hole 16a and 16b. The use of the round hole 16a and 16b is particularly advantageous in that the bondability of each terminal strip 15a and 15b to the associated surface of the substrate 2 will can be increased as compared with the obstacle removal portion of a kind which open to the outside at one side edge of the associated terminal strip.

Modification

Figure 9A:
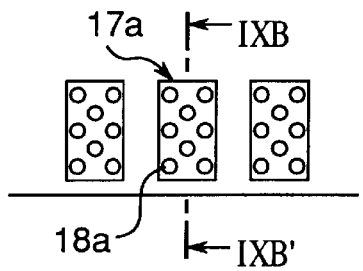
FIG. 9A is a view similar to FIG. 2A, showing a modification of the third preferred embodiment of the present invention.
Figure 9B:
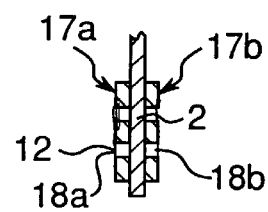
FIG. 9B is a cross-sectional view taken along the line IXB-IXB' in FIG. 9A.

FIGS. 9A and 9B illustrate a modification of the third embodiment. In this modification, the obstacle removal portion comprises a plurality of round holes 18a and 18b each defined in each of the terminal strips 17a and 17b on the respective surfaces of the substrate 2.

Fourth Embodiment

Figure 10A:
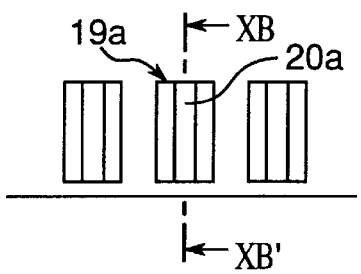
FIG. 10A is a view similar to FIG. 2A, showing a fourth preferred embodiment of the present invention.
Figure 10B:
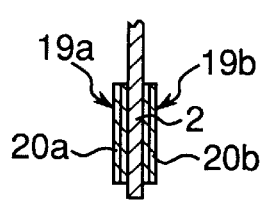
FIG. 10B is a cross-sectional view taken along the line XB-XB' in FIG. 10A.

In this embodiment, as shown in FIGS. 10A and 10B, the obstacle removal portion defined in each of the terminal strips now identified by 19a and 19b on the respective surfaces of the substrate 2 comprises at least one longitudinal protrusion 20a and 20b positioned intermediate of the width of the associated terminal strip 19a and 19b so as to extend in a direction parallel to the longitudinal sense of the associated terminal strip 19a and 19b. In this embodiment, a lower edge portion of the longitudinal protrusion 20a and 20b serves to clear the foreign matter 30 out of the path as the male connector 7 is inserted into the female socket 51.

First Modification

Figure 11A:
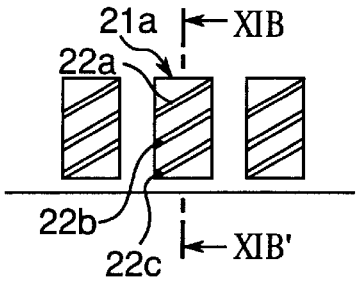
FIG. 11A is a view similar to FIG. 2A, showing a first modification of the fourth preferred embodiment of the present invention.
Figure 11B:
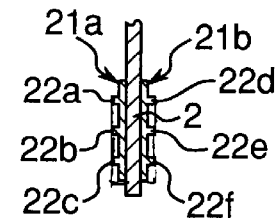
FIG. 11B is a cross-sectional view taken along the line XI-XIB' in FIG. 11A.

A first modification of the fourth embodiment of the present invention is shown in FIGS. 11A and 11B. As shown therein, the obstacle removal portion defined in each of the terminal strips now identified by 21a and 21b on the respective surfaces of the substrate 2 comprises a plurality of, for example, three slant protrusions 22a, 22b and 22c or 22d, 22e and 22f extending slantwise from one side of the associated terminal strip 21a and 21b to the opposite side thereof.

As is the case with the modification shown in FIGS. 7A and 7B, the slant protrusions 22a to 22f are particularly advantageous in that the foreign matter 30 caught in at least one of the inclined cutouts 22a to 22f can be guided upwardly therealong to clear out of the associated terminal strip 21a or 21b as the male connector 7 is inserted into the female socket 51.

Second Modification

Figure 12A:
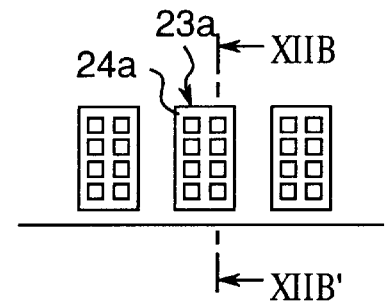
FIG. 12A is a view similar to FIG. 2A, showing a second modification of the fourth preferred embodiment of the present invention.
Figure 12B:
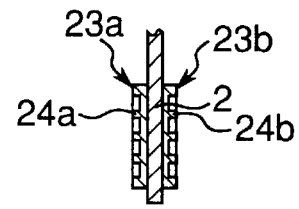
FIG. 12B is a cross-sectional view taken along the line XII-XIIB' in FIG. 12A.

According to a second modification of the third embodiment of the present invention shown in FIGS. 12A and 12B, the obstacle removal portion defined in each of the terminal strips now identified by 23a and 23b on the respective surfaces of the substrate 2 comprises a grid pattern of longitudinal and transverse protrusions 24a and 24b.

Third Modification

Figure 13A:
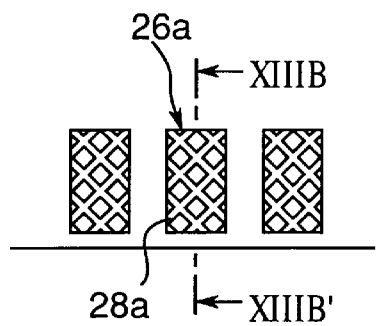
FIG. 13A is a view similar to FIG. 2A, showing a third modification of the fourth preferred embodiment of the present invention.
Figure 13B:
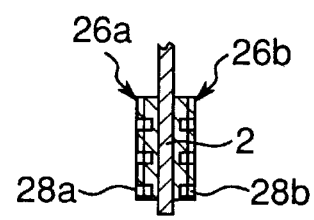
FIG. 13B is a cross-sectional view taken along the line XIII-XIIIB' in FIG. 13A.
Figure 14:
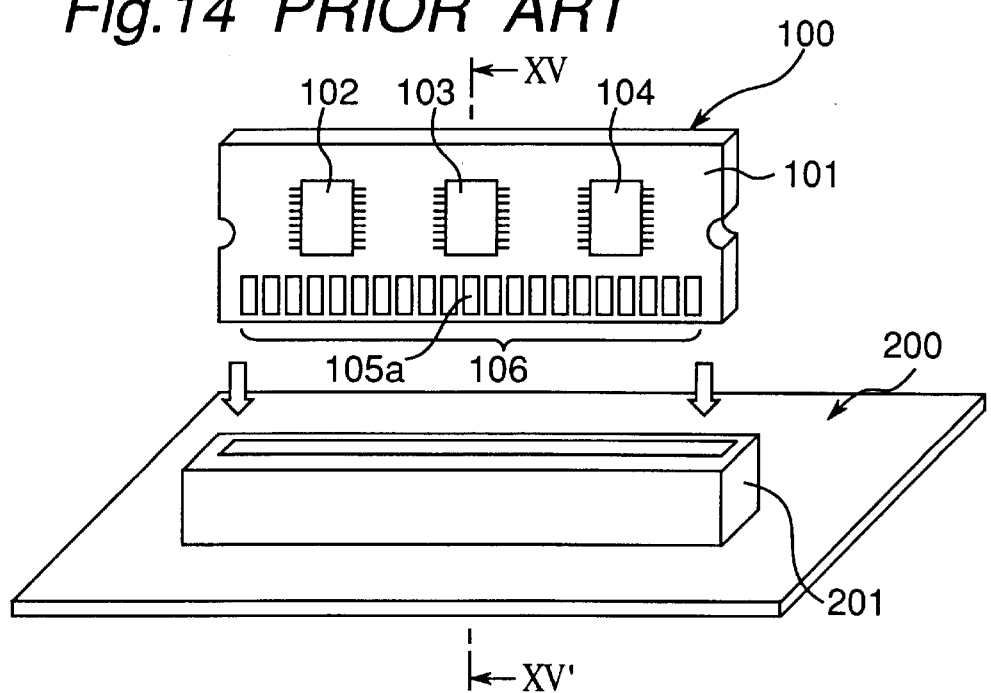
FIG. 14 illustrates a schematic perspective view of the prior art terminal structure, showing the memory module and the printed circuit board having the female socket for the memory module.
Figure 15:
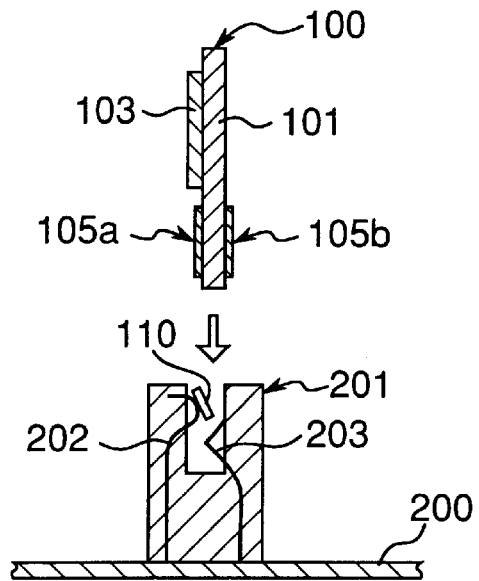
FIG. 15 is a cross-sectional view taken along the line m-m' in FIG. 14.
Figure 16:
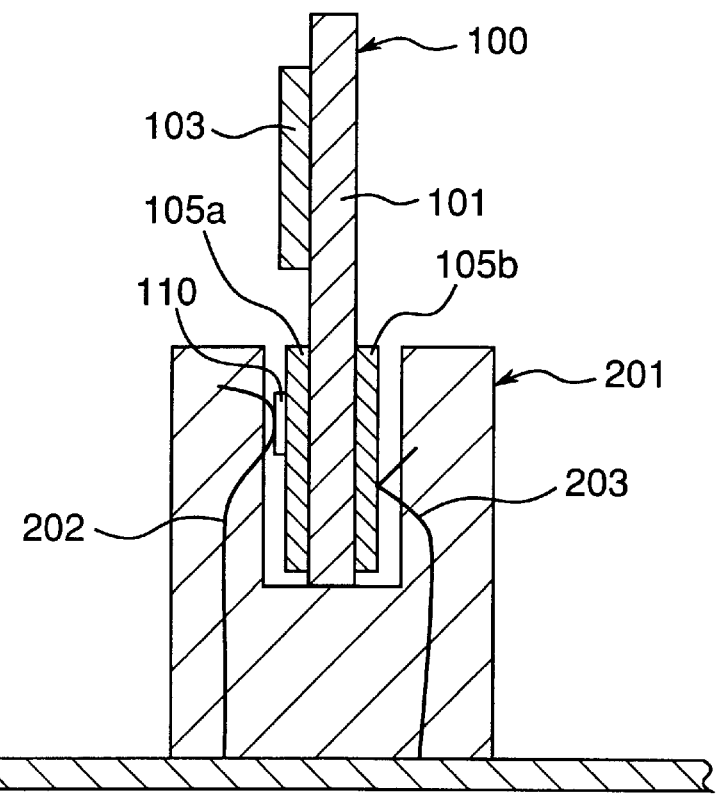
FIG. 16 is a view similar to FIG. 15, showing the memory module inserted into the female socket on the printed circuit board.

According to a third modification of the third embodiment of the present invention shown in FIGS. 13A and 13B, the obstacle removal portion defined in each of the terminal strips now identified by 26a and 26b on the respective surfaces of the substrate 2 comprises a plurality of rows of recesses 26a and 26b each row extending slantwise relative to the longitudinal sense of the respective terminal strip 26a and 26b.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A memory module comprising:

a substrate, a plurality of memory chips mounted on said substrate, a male connector formed along one side of said substrate, said male connector having a plurality of terminal strips adapted to be engaged with terminal tongues in a female socket, and a plurality of obstacle removal portions comprising at least one of a cutout, a recess, and a protrusion defined in each of said plurality of terminal strips for removing foreign matter present on corresponding one of said terminal tongues.

2. A terminal structure as claimed in claim 1, wherein the obstacle removal portion comprises at least one cutout defined in the respective terminal strip so as to extend in a direction generally perpendicular to a longitudinal sense of the terminal strip, said cutout dividing the respective terminal strip into two strip pieces.

3. A terminal structure as claimed in claim 1, wherein the obstacle removal portion comprises at least one generally U-shaped cutout defined in the respective terminal strip so as to extend inwardly from one side of the respective terminal strip.

4. A terminal structure as claimed in claim 3, wherein the U-shaped cutout extends diagonally upwardly from a point on the respective terminal strip to one side of such terminal strip.

5. A terminal structure as claimed in claim 1, wherein the obstacle removal portion comprises at least one protrusion defined in the respective terminal strip so as to extend in a direction parallel to a direction of insertion of the module into the female socket.

6. A terminal structure as claimed in claim 1, wherein the obstacle removal portion comprises at least one protrusion defined in the respective terminal strip so as to extend in a direction at an angle relative to a direction of insertion of the module into the female socket.

7. A terminal structure as claimed in claim 1, wherein the obstacle removal portion comprises a plurality of protrusions defined in the respective terminal strip and arranged in a grid pattern.

8. A terminal structure as claimed in claim 1, wherein the obstacle removal portion comprises a plurality of recesses defined in the respective terminal strip and arranged in a grid pattern.

9. A memory module comprising:

a substrate, a plurality of memory chips mounted on said substrate, a male connector formed along one side of said substrate, said male connector having a plurality of terminals forming a terminal array on at least one side of said substrate and adapted to be engaged with terminal tongues in a female socket, and a plurality of obstacle removal portions each defined in each of said plurality of terminal strips for removing foreign matter present on corresponding one of said terminal tongues.

* * * * *